July 31, 1962 A. Q. MOWATT 3,047,648

TRANSISTOR CLIP, HEAT SINK TYPE

Filed May 4, 1959

INVENTOR:
Allan Q. Mowatt

By Willard M. Graham
Agent,

United States Patent Office 3,047,648

Patented July 31, 1962

3,047,648

TRANSISTOR CLIP, HEAT SINK TYPE

Allan Q. Mowatt, Lexington, Mass., assignor, by mesne assignments, to Northrop Corporation, Beverly Hills, Calif., a corporation of California Filed May 4, 1959, Ser. No. 810,889
2 Claims. (Cl. 174—16)

This invention has to do with electronics and more particularly with a holder or clip for electronic components.

With the relatively recent development of transistors along with the miniaturization and subminiaturization of electronic components an increasingly apparent problem was created. There was no reliable method or device for holding the components in their respective environments. For instance, transistors were incorporated into printed circuits and these circuits, in the nature of "units" were subjected to and were required to pass certain rigid tests. The tests constituted, in some instances, severe vibrations or shocks. The absence of proper holding means resulted in the transistors being separated from the units. In short, they broke loose. Adding to the problem of adequately holding a transistor was the fact that the "can" of the semiconductor was tapered. The angle of taper was not large but it was an added complication to the solution of the problem.

Additionally, electrical and electronic components, in operation, heat or get hot and also are subjected to heat from other components. As a result optimum and efficient operation of the components is decreased or greatly impaired.

An object of this invention is to provide a clip for miniature electrical and electronic components as well as other devices that will reliably hold the component in its proper location and environment regardless of the normal abuse that may be applied.

Another object of this invention is to provide a clip for transistors and other devices that has a plurality of resilient elements that provide a multiple contact and holding area that may engage the tapered component to be held.

A yet further object of this invention is to provide a clip, having a tab thereon, for transistors that extend into the printed circuit unit and prevents rotation of the clip when the unit is in use and subjected to certain vibrations.

A still further object of this invention is to provide a clip, for transistors and other devices, that has a tab that prevents the device from being shaken from the clip.

Another object of this invention is to provide a panel on a clip that functions as a heat sink to reduce the temperature of the held component.

Briefly, the device comprises a U-shaped body having a bight or plate that is attached to a printed circuit unit or other device. The legs of the body are resilient to provide a firm contact on the component to be held. A pair of tabs are provided, one of which extends into an opening in a unit and prevents rotation of the clip and the other of which extends in the same direction as the legs and prevents inadvertent removal of the component from the clip. A heat sink panel is also provided that is in contacting engagement with the held component.

Figures 1, 2:
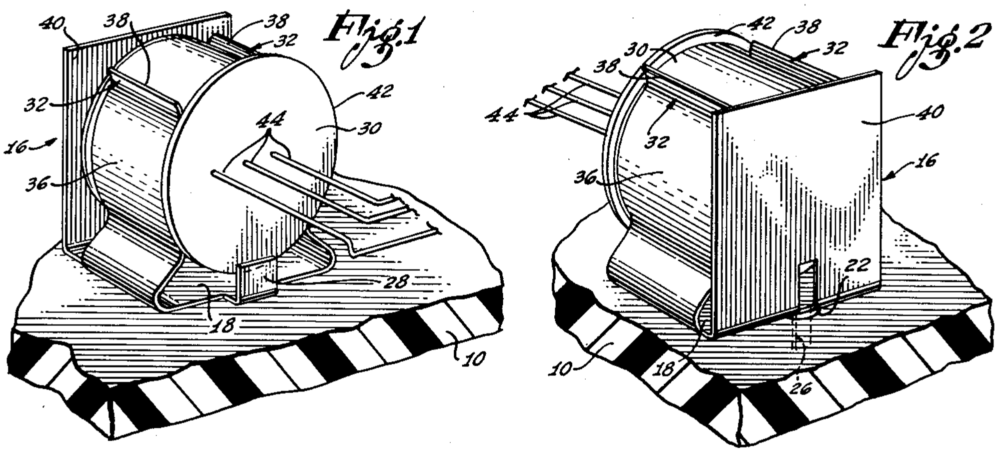
FIGURE 1 is a fragmentary perspective view illustrating and having embodied therein the present invention as it may be used in a printed circuit unit.
FIGURE 2 is a fragmentary perspective view of the clip showing that end opposed to the view of FIGURE 1.

Referring to the drawings for a more detailed description of the present invention 10 designates a printed circuit unit which in the present instance comprises a board. Most of the printed circuit components and related structure are located on the board.

The clip, broadly designated 16, is a U-shaped body having a bight or plate 18. The plate has an opening 19 therethrough through which a rivet or fastener 20 extends for the purpose of attaching the clip to the unit 10.

The board 10 has an opening 22 therein into which extends a tab 26. The tab 26 in combination with the rivet 20 prevents the clip 16 from rotating on the unit 10.

Another stop tab 28 extending in a direction opposed to that of tab 26 contacts the component or article 30 when one is present or is in a position to prevent inadvertent removal of the component from the clip as a result of certain imposed vibrations or other conditions.

The legs 32, with reference to the bight, bend inwardly, outwardly, and then inwardly to provide a concavo-convexo area 36 which receives the component 30. Then the legs bend outwardly on the free end 38 to provide an entrance area for the component.

Integral with the bight and spaced from the legs is a substantially square heat sink panel 40 that, in its normal operating condition, is in contacting relationship with the component 30. Panel 40 extends in the same direction as tab 28. It is to be noted that the panel is substantially as wide as the body, but is longer than the body measuring from the base to the free end of the legs.

Figure 3:
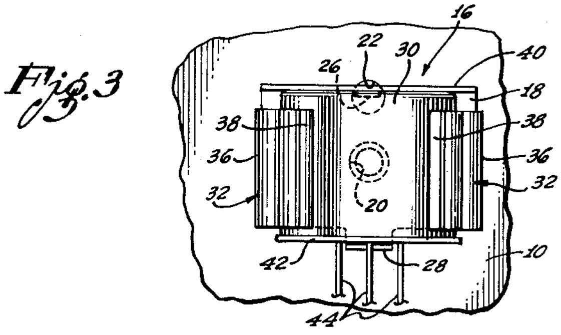
FIGURE 3 is a plan elevation view illustrating the clip and the position assumed by the resilient legs when a tapered component such as a transistor is held.
Figure 4:
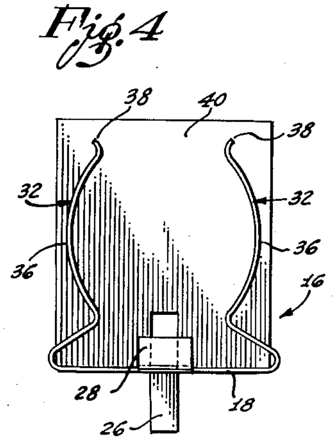
FIGURE 4 is a front elevation view of the clip.
Figure 5:
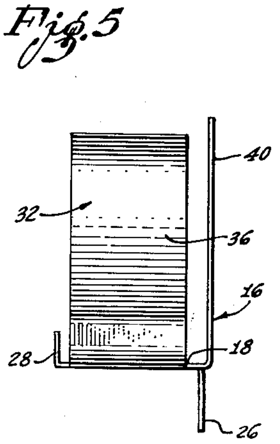
FIGURE 5 is a side elevation view of the clip.
Figure 6:
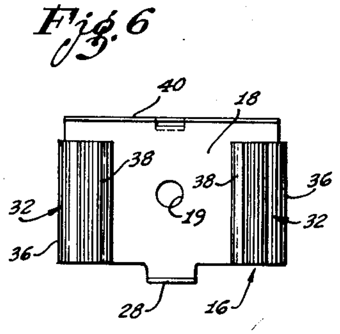
FIGURE 6 is a plan elevation view of the clip.

The operation and mounting of the clip 16 is as follows: The tab 26 is properly located in the opening 22 and the clip is fastened in place by the rivet or fastener 20. The component 30 in the nature of a transistor having a tapered can or body is pressed or snapped into place, as illustrated with the annular flange 42 of the can between tab 26 and 28 and adjacent tab 28. The flange 42 extends beyond the legs 32 and is between the latter and the tab 28 in the manner illustrated in FIGURES 1, 2, and 3. This is done to prevent the component from moving outwardly of the clip 16. That end of the component in opposed relationship to the flange 42 is in contacting relationship with panel 40. In this way heat is "drawn off" the component resulting in its optimum and efficient operation.

As illustrated, the transistor cannot move out of the clip in the direction opposed to the tab 28 because the flange 42 is between the tab 28 and the legs 32. The panel 40 also provides an obstruction to the removal of the component. The component 30 may only be inserted or removed from the clip 16 by lifting up or pressing the same down between the legs 32.

It is to be noted that the component 30 does not touch or contact the bight 18. Such vibration and shock as is imposed on the component is taken or absorbed by the resilient legs 32. As a result, a severe impact is not imposed on the semiconductor. Each leg will move in the same direction as each other leg and in the same amount when vibrations are present. Therefore, the component is always firmly held and random vibrations that may originate or stem from the bight 18, or other structure, are not imposed in their full force on the legs 32 or the component 30. Further, the electrical leads 44 extending out of the transistor 30 are not subjected to severe forces that come from several conflicting directions. As a result these delicate wires are adequately protected against severing or breaking. Additionally, the space between the areas 36 and the bight 18 provides space through which air may circulate to help cool the component 30.

An example, which may be readily multiplied many times, will be given to illustrate the severe conditions to which the clip 16 is subjected.

First a unit 10 is fabricated with clips 16 and components 30 attached. This unit is then subjected to very severe vibration and shock tests in an effort to simulate the actual conditions of operation. However, most vibration and shock instruments are capable of only creating one frequency at a time although many frequencies may be subsequently applied. The clips 16 must be capable of holding the components 30 firmly in place in order that the delicate electrical leads 44 will not fracture or break.

Once this initial test is complete the unit 10 may then be placed in a missile. Again a test is applied. The missile is tested in the test stand with the rocket motors, or jet engines operating. Again severe strains are imposed on the clips 16. White noise or many random frequencies are applied to the unit 10. Very severe vibrations are imposed on the unit 10. Through all these shocks and vibrations the clips 16 must hold the components 30 in a firm and reliable position. Anything less will result in severing the leads 44.

These testings in place may occur several times for the reason that one or more components may have suffered breakage in one or more of the tests.

However, there is one test that can occur only once. This last test is the most severe of all. It is the actual launch of the missile itself. Again the white noise frequencies are imposed, but they are greater than all that have gone before. The missile itself and all components vibrate severely just before and during the launch. The magnitude of vibration forces imposed is unbelievable unless actually experienced. The clips 16 must hold the components 30. If a component were to be shaken from its position it is almost a certainty that the leads 44 would break. The result is obvious; the missile launch would become an absolute failure. Another factor must also be considered. If the leads 44 were to break resulting in malfunctions during the launch the missile could become a lethal weapon out of control. Life and property would be in extreme danger.

Therefore, the absolute reliability of the clips 16 must be known and assured. Anything less is worthless.

While in order to comply with the statute, the invention has been described in language more or less specific as to structural features, it is to be understood that the invention is not limited to the specific features shown, but that the means and construction herein disclosed comprise a preferred form of putting the invention into effect, and the invention is therefore claimed in any of its forms or modifications within the legitimate and valid scope of the appended claims.

What is claimed is:

1. In combination with an electrical article of manufacture having a generally cylindrical housing and a substantially flat end, a heat sink type retaining device comprising a generally U-shaped body having a pair of integral legs and a bight, a first tab on one end of said bight that extends in the same direction as said legs, a heat sink panel, substantially as wide as said body and as long as said legs, integral with the other end of said bight and extending in the same direction as said legs, a second tab at said other end of said bight extending in the direction opposed to said legs and being formed by a cut-out in said body at the junction of said panel, said article mounted with said housing between said legs and said flat end against said panel, said first tab being only long enough to overlap the edge of said article opposite said flat end, and positioned to hold a substantial area of said flat end in heat exchanging contact with said panel.

2. In combination with an electrical power article of the class described having a generally cylindrical housing, a substantially flat first end, and electrical leads projecting from the other end; a single-piece heat sink retaining device comprising a generally U-shaped body having a pair of integral spring legs and a bight, said legs extending upwardly from opposite sides of said bight and having respective inwardly facing arcuate surfaces with the lower ends thereof positioned appreciably away from said bight, said surfaces being nearly as wide as the length of said housing and having a radius of curvature substantially equal to that of said housing; a first tab on one end of said bight that extends in the same direction as said legs; a heat sink panel, substantially as wide as said body, integral with the other end of said bight and extending in the same directioin as said legs; a second tab at said other end of said bight extending in the direction opposed to said legs and integral with said body; said article mounted with said housing gripped in heat exchanging contact with said legs and spaced appreciably above said bight thereby; said first tab being only long enough to overlap said other end of said article without contacting said leads, and positioned to hold substantially the full area of said flat first end in heat exchanging contact with said panel.

References Cited in the file of this patent

UNITED STATES PATENTS

| | | |
|---|---|---|
| 1,032,527 | Bainum | July 16, 1912 |
| 1,174,138 | Gauvreau | Mar. 7, 1916 |
| 2,541,828 | Peck | Feb. 13, 1951 |
| 2,795,834 | Szoke | June 18, 1957 |
| 2,808,576 | Brown | Oct. 1, 1957 |
| 2,909,354 | Bingham | Oct. 20, 1959 |

FOREIGN PATENTS

| | | |
|---|---|---|
| 257,320 | Great Britain | Aug. 23, 1926 |